US012696697B2

(12) United States Patent
Ushijima et al.

(10) Patent No.: US 12,696,697 B2
(45) Date of Patent: Jul. 28, 2026

(54) SEMICONDUCTOR DEVICE AND METHOD OF MANUFACTURING THE SAME

(71) Applicants: DENSO CORPORATION, Kariya-city (JP); TOYOTA JIDOSHA KABUSHIKI KAISHA, Toyota (JP); MIRISE Technologies Corporation, Nisshin (JP); HAMAMATSU PHOTONICS K.K., Hamamatsu (JP)

(72) Inventors: Takashi Ushijima, Nisshin (JP); Masatake Nagaya, Nisshin (JP); Daisuke Kawaguchi, Hamamatsu (JP); Keisuke Hara, Hamamatsu (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP); HAMAMATSU PHOTONICS K.K., Hamamatsu (JP)

( * ) Notice: Subject to any disclaimer, the term of this patent is extended or adjusted under 35 U.S.C. 154(b) by 549 days.

(21) Appl. No.: 18/061,653

(22) Filed: Dec. 5, 2022

(65) Prior Publication Data

US 2023/0197442 A1 Jun. 22, 2023

(30) Foreign Application Priority Data

Dec. 22, 2021 (JP) .................................. 2021-208658

(51) Int. Cl.
*H01L 21/02* (2006.01)
*H10D 62/85* (2025.01)
*H10P 14/60* (2026.01)

(52) U.S. Cl.
CPC ..... *H10P 14/6542* (2026.01); *H10D 62/8503* (2025.01)

(58) Field of Classification Search
CPC ...... H10P 14/6542; H10P 95/11; H10P 90/00; H10P 90/16; H10D 62/8503;
(Continued)

(56) References Cited

U.S. PATENT DOCUMENTS 6,924,159 B2 * 8/2005 Usui ................... H01L 21/0242
257/E21.12
7,727,874 B2 * 6/2010 Hanser ................ H10H 20/817
257/E21.563
(Continued)

*Primary Examiner* — Jay C Kim
(74) *Attorney, Agent, or Firm* — Posz Law Group, PLC

(57) ABSTRACT

A method of manufacturing a semiconductor device includes irradiation of laser on a semiconductor substrate and cutting of the semiconductor substrate. The laser is irradiated on the semiconductor substrate while moving a focal point of the laser inside the semiconductor substrate. The semiconductor includes a specific crystal plane that is easier to be cleaved, and that is tilted to the surface of the semiconductor substrate. The irradiation of the laser includes repetition of a specific modified layer formation process in which one of the specific modified layers along the specific crystal plane is formed by moving the focal point along the specific crystal plane. In the irradiation of the laser, the specific modified layers are arranged in a direction parallel to the surface of the semiconductor substrate. In the cutting of the semiconductor substrate, the semiconductor substrate is cut along the specific modified layers.

10 Claims, 12 Drawing Sheets

(58) Field of Classification Search
CPC ......... H01L 21/02354; H01L 21/02032; H01L 21/7806; H01L 21/02002
See application file for complete search history.

(56) References Cited

U.S. PATENT DOCUMENTS

| | | | |
|---|---|---|---|
| 8,507,304 B2 * | 8/2013 | Kryliouk | H01L 21/02488 |
| | | | 257/E21.113 |
| 8,853,064 B2 * | 10/2014 | Lee | H01L 21/0254 |
| | | | 438/492 |
| 9,196,477 B2 * | 11/2015 | Cheng | H01L 21/0243 |
| 9,209,021 B2 * | 12/2015 | Okuno | H10D 62/8503 |
| 9,263,258 B2 * | 2/2016 | Nagai | H01L 21/0242 |
| 9,356,183 B1 * | 5/2016 | Sheldon | H10F 10/163 |
| 9,391,147 B2 * | 7/2016 | Lander | H10D 62/82 |
| 11,011,374 B2 * | 5/2021 | Sumida | H01L 21/02458 |
| 11,164,939 B2 * | 11/2021 | Ramvall | H10D 12/211 |
| 2010/0155704 A1 * | 6/2010 | Oh | H01L 21/0254 |
| | | | 257/E21.09 |
| 2010/0275836 A1 * | 11/2010 | Sato | C30B 29/406 |
| | | | 117/97 |
| 2019/0224784 A1 | 7/2019 | Fujiwara et al. | |
| 2019/0326402 A1 * | 10/2019 | Okamoto | C30B 29/406 |
| 2022/0055156 A1 | 2/2022 | Tanaka et al. | |
| 2022/0093463 A1 | 3/2022 | Tanaka et al. | |

* cited by examiner

SEMICONDUCTOR DEVICE AND METHOD OF MANUFACTURING THE SAME

CROSS REFERENCE TO RELATED APPLICATION

This application is based on Japanese Patent Application No. 2021-208658 filed on Dec. 22, 2021, the disclosure of which is incorporated herein by reference.

TECHNICAL FIELD

The present disclosure relates to a semiconductor device and a method of manufacturing the semiconductor device.

BACKGROUND

A method of manufacturing a semiconductor substrate may include a laser irradiation process and a cutting process. In the laser irradiation process, a laser may be irradiated on the semiconductor substrate such that a focal point of the laser is moved along a surface of the semiconductor substrate inside the semiconductor substrate. Thereby, a modified layer is formed inside the semiconductor substrate. In the cutting process, the semiconductor substrate may be cut along the modified layer. As a result, the semiconductor substrate with a slim thickness may be acquired.

SUMMARY

The present disclosure describes a semiconductor device having a semiconductor substrate, and further describes a method of manufacturing the semiconductor device including irradiation of a laser on the semiconductor substrate and cutting of the semiconductor substrate.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
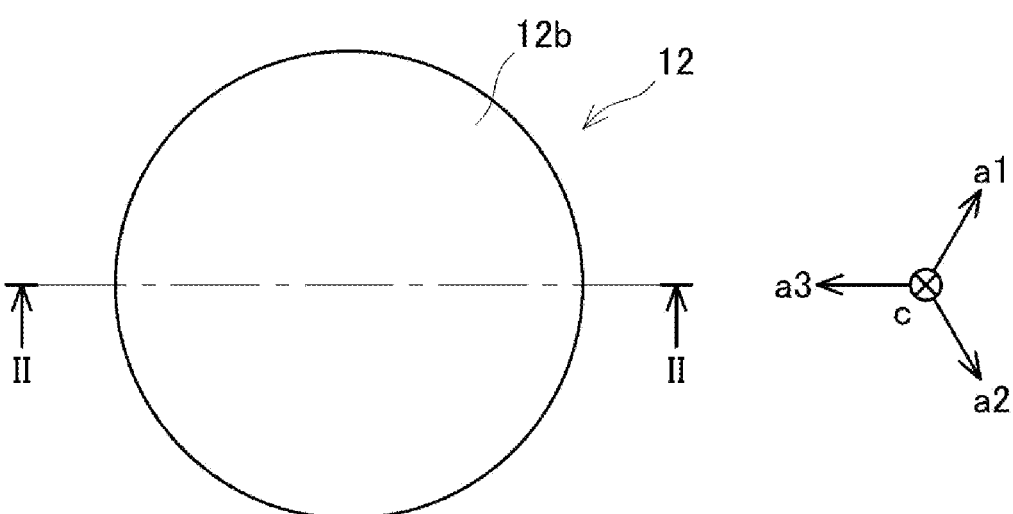
FIG. 1 is a plan view of a semiconductor substrate.

A semiconductor substrate included in a semiconductor device may have a characteristic in which cleavage easily occurs at a specific crystal plane as compared with other crystal planes. When a modified layer is formed inside the semiconductor substrate through laser irradiation, stress may be generated inside the semiconductor substrate. As a result, when the modified layer is formed, a crack may be generated along the specific crystal plane from the modified layer. When the semiconductor substrate is cut, the semiconductor substrate may be cut along a crack in a portion of a region, and roughness with large protrusions and recessions may be formed on a cutting plane.

According to a first aspect of the present disclosure, a method of manufacturing a semiconductor device includes irradiation of a laser on a semiconductor substrate while moving a focal point of the laser inside the semiconductor substrate and cutting of the semiconductor substrate. The semiconductor substrate includes a specific crystal plane that is easier to be cleaved than a crystal plane parallel to a surface of the semiconductor substrate, and that is tilted to the surface of the semiconductor substrate. The irradiation of the laser includes repetition of a specific modified layer formation process. In the specific modified layer formation process, one of specific modified layers extending along the specific crystal plane is formed by moving the focal point along the specific crystal plane. In the irradiation of the laser, the specific modified layers are formed such that the specific modified layers are arranged in a direction parallel to the surface of the semiconductor substrate. In the cutting of the semiconductor substrate, the semiconductor substrate is cut along the specific modified layers.

With regard to the manufacturing method described above, in the laser irradiation process, the specific modified layer formation process is repeated conducted for moving the focal point of the laser along the specific crystal plane inside the semiconductor substrate. When the focal point of the laser is moved along the specific crystal plane, the crack hardly occurs along the specific crystal plane when the specific modified layer is formed. In the laser irradiation process, multiple modified layers are formed to be arranged in a direction parallel to the surface of the semiconductor substrate. Therefore, in the subsequent cutting process, it is possible to cut the semiconductor substrate along the surface of the semiconductor substrate. Since the crack hardly occurs in the laser irradiation process, it is also possible to inhibit the generation of large roughness at the cutting plane of the semiconductor substrate. In other words, according to the above manufacturing method, the shape of the cutting plane can be controlled accurately.

According to a second aspect of the present disclosure, a semiconductor device includes a semiconductor substrate that has a front surface and a rear surface located on a side opposite from the front surface. The semiconductor substrate includes a specific crystal plane that is easier to be cleaved than a crystal plane parallel to the front surface of the semiconductor substrate and that is tilted to the front surface of the semiconductor substrate. The rear surface has roughness with multiple protrusions. Each of the protrusions has a tilted surface extending along the specific crystal plane.

According to the structure of the above-mentioned semiconductor device, it is possible to inhibit the generation of large roughness at the cutting plane of the semiconductor substrate.

With regard to the above-mentioned manufacturing method, in the process of irradiating the laser, in a view of the semiconductor substrate along the thickness direction, multiple specific modified layer may be formed such that one specific modified layer partially overlaps the adjacent specific modified layer.

According to the structure, in a case where a crack occurs at a position of the focal point of the laser, the crack easily intersects the specific modified layer that is already formed. When the crack intersects the specific modified layer, the progression of the crack tends to stop at the position of the specific modified layer. Therefore, it is possible to inhibit the generation of a deep crack according to this structure.

With regard to the above-mentioned manufacturing method, in the process of irradiating the laser, a process of forming the connection modified layer may be conducted between present execution of the specific modified layer formation process and subsequent execution of the specific modified layer formation process. The subsequent execution of the specific modified layer formation process is subsequent to the present execution of the specific modified layer formation process. The connection modified layer is formed by moving the focal point of the laser from the end position of the focal point in the present execution to the start point of the focal point in the subsequent execution.

According to this structure, since the modified layer is continuously formed, the semiconductor substrate can be easily cut in the cutting process.

In the manufacturing method, the connection modified layer may be tilted to the surface of the semiconductor substrate on a side opposite from the specific modified layer.

In a case of forming the connection modified layer, the following structure may be acquired in the above-mentioned manufacturing method. The specific crystal plane may be a first specific crystal plane. The semiconductor substrate may have a second specific crystal plane that is easier to be cleaved than the crystal plane parallel to the surface of the semiconductor substrate and that is tilted to the surface of the semiconductor substrate. The connection modified layer may extend along the second specific crystal plane.

In the structure, since the connection modified layer is formed along the second specific crystal plane that is easily to be cleaved, the crack is hardly generated at the formation of the connection modified layer.

In a case of forming the connection modified layer, the angle between the connection modified layer and the surface of the semiconductor substrate may be equal to the angle between the specific modified layer and the surface of the semiconductor substrate. According to this structure, the crack is hardly generated at the formation of the connection modified layer.

In the above-mentioned manufacturing method, the surface of the semiconductor substrate may be a first surface. The semiconductor substrate may have a second surface located on a side opposite from the first surface. In the process of irradiating the laser, the laser may be irradiated on the semiconductor substrate from the second surface. In each of the specific modified layer formation processes, the focal point of the laser may be moved from the second surface toward the first surface along the specific crystal plane.

According to this structure, it is possible to effectively inhibit the generation of the crack extending from the position of the focal point of the laser toward the second surface.

With regard to the manufacturing method in which the focal point of the laser is moved from the second surface to the first surface along the specific crystal plane, in each of the specific modified layer formation processes, when the focal point of the laser moves from the start position of the focal point, the energy of the laser may be increased along with the movement of the focal point.

According to this structure, it is possible to effectively inhibit the generation of the crack extending from the position of the focal point of the laser toward the second surface.

In the manufacturing method described above, the semiconductor substrate may be made of gallium nitride. The surface of the semiconductor substrate may be parallel to a c-plane of the gallium nitride. The specific crystal plane may be a (11-28) plane of the gallium nitride.

In the manufacturing method described above, the semiconductor substrate may be made of gallium nitride. The surface of the semiconductor substrate may be parallel to a c-plane of the gallium nitride. The specific crystal plane may be tilted to the c-plane at an angle of 21.8 degrees in a cross section along an m-plane of the gallium nitride.

Figure 2:
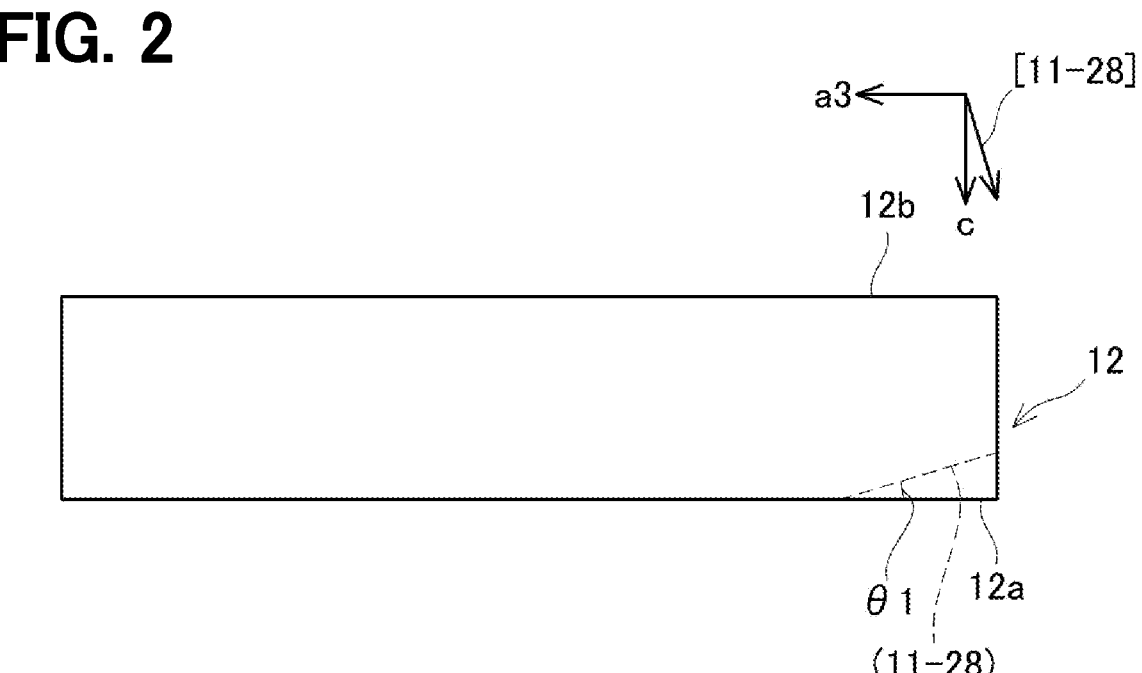
FIG. 2 is a cross-sectional view of the semiconductor substrate taken along line II-II in FIG. 1.

(First Embodiment) FIG. 1 illustrates a semiconductor substrate 12 to be processed. The semiconductor substrate 12 is made of gallium nitride single crystal, and has a hexagonal crystal structure. Symbols a1, a2, a3, and c in each drawing respectively indicate a1-axis, a2-axis, a3-axis, and c-axis of the hexagonal crystal. FIG. 2 shows a cross section taken along line II-II in FIG. 1. The cross section illustrated in FIG. 2 represents an m-plane. The m-plane is a (1-100) plane. As illustrated in FIG. 2, the semiconductor substrate 12 includes a first surface 12a and a second surface 12b as main surfaces. The first surface 12a includes a c-plane. The c-plane is a (0001) plane. The second surface 12b is located on a side opposite from the first surface 12a, and is parallel to the first surface 12a. The dashed line in FIG. 2 indicates the (11-28) plane perpendicular to a [11-28] direction. The angle θ1 in FIG. 2 indicates a tilted angle of the (11-28) plane with respect to the first surface 12a. The angle θ1 is 21.8 degrees. The (11-28) plane is a crystal plane that is easier to be cleaved than the c-plane. The crystal plane described in the present disclosure may also be referred to as a crystal face.

Figure 3:
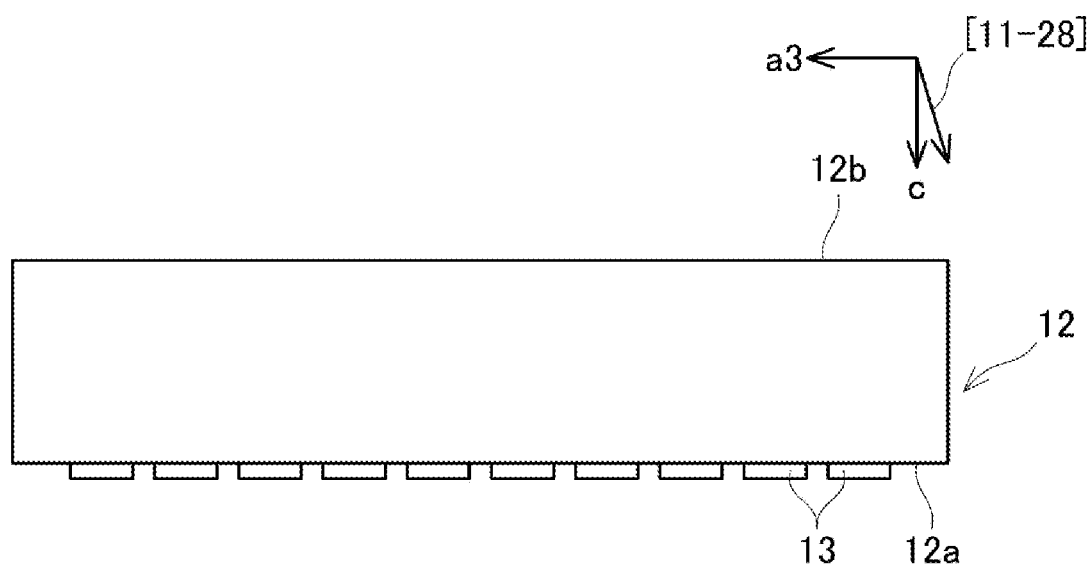
FIG. 3 is a cross-sectional view of the semiconductor substrate after an element structure formation process.

(Element Structure Formation Process) In a manufacturing method according to a first embodiment, an element structure formation process is initially performed. In the element structure formation process, as illustrated in FIG. 3, a semiconductor element structure is formed at a region of the semiconductor substrate 12 at the first surface 12a side. For example, a dopant diffusion layer is formed at a semiconductor region in the vicinity of the first surface 12a. An electrode 13 is formed at the first surface 12a.

Figure 4:
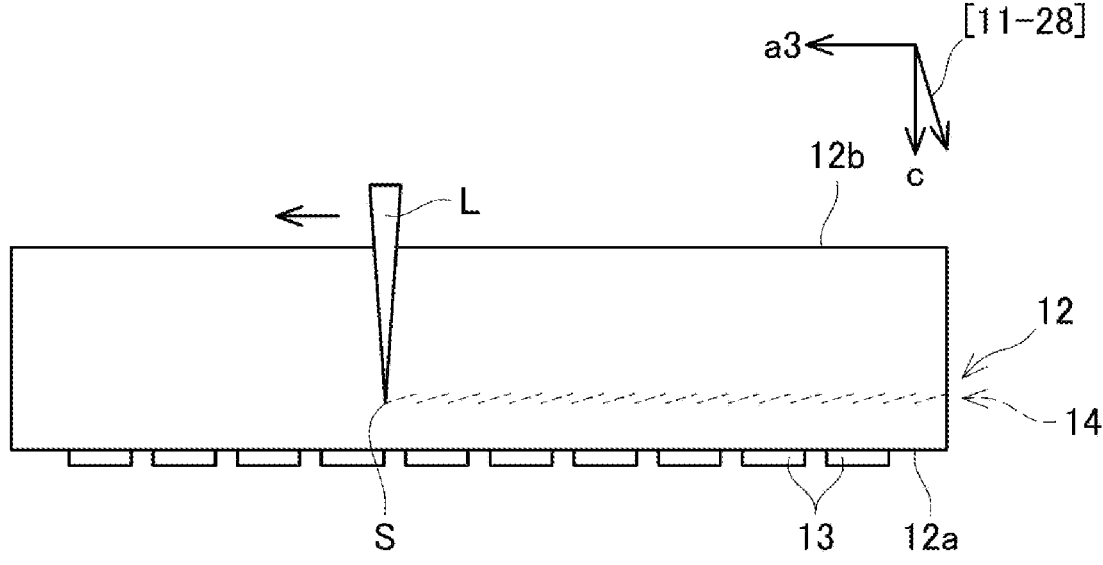
FIG. 4 is a cross-sectional view that illustrates a laser irradiation process according to a first embodiment.
Figure 5:
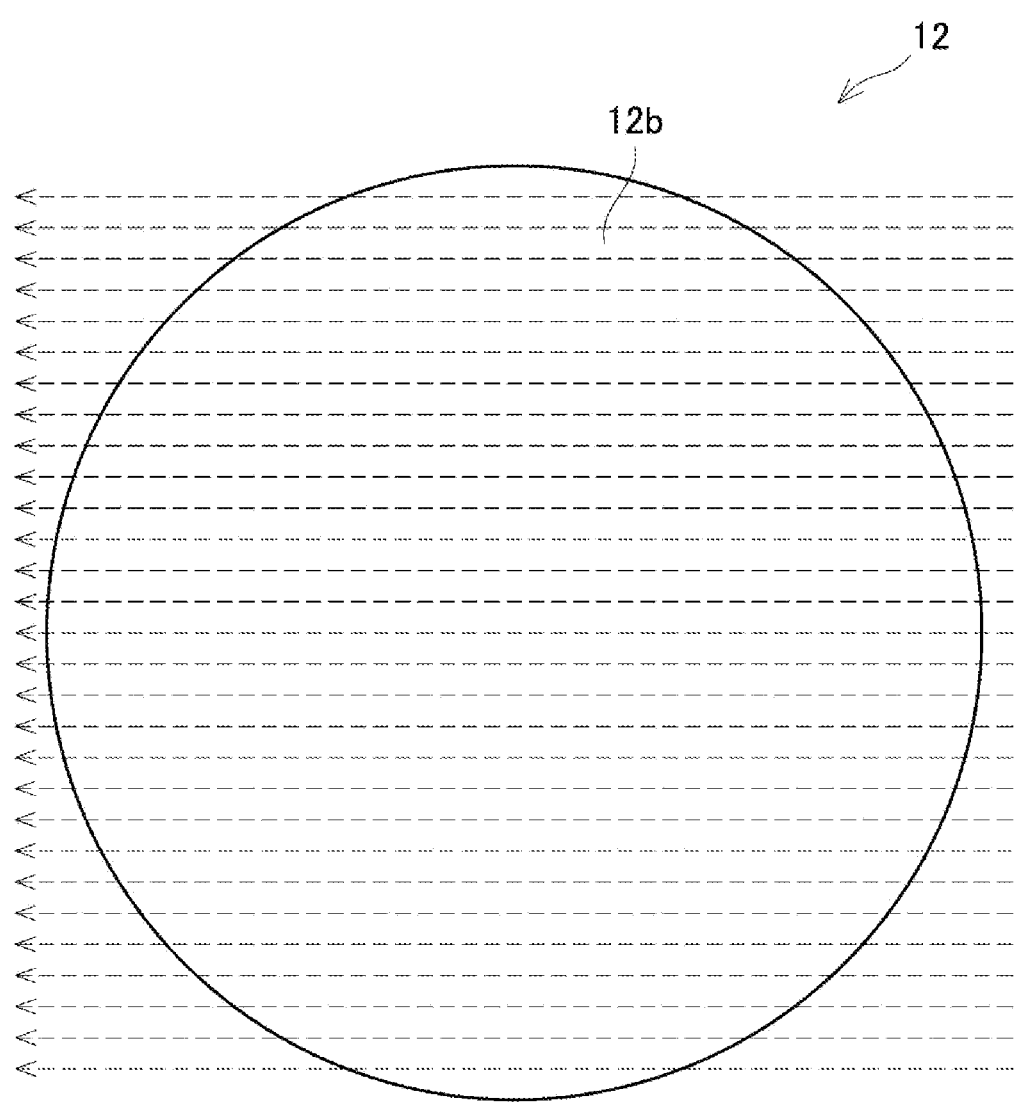
FIG. 5 is a plan view that illustrates a path traced by a laser's focal point in the laser irradiation process according to the first embodiment.
Figure 5:
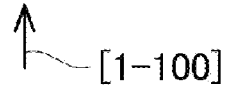
Figure 5:
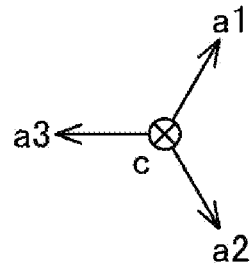

(Laser Irradiation Process) Subsequently, a laser irradiation process is performed. As illustrated in FIG. 4, in the laser irradiation process, the semiconductor substrate 12 is irradiated with a laser L from the second surface 12b. The semiconductor substrate 12 has optical transparency. The semiconductor substrate 12 is irradiated with the laser L so that the focal point S is formed inside the semiconductor substrate 12. The semiconductor substrate 12 is heated and decomposed at the position of the focal point S. As a result, a modified layer 14 with reduced crystallinity is formed at the position of the focal point S. For example, the modified layer 14 includes, for example, gallium deposited by decomposition of gallium nitride. The modified layer 14 extending along the first surface 12a is formed by moving the focal point S in a3 direction. As indicated by the arrow in FIG. 5, the process of moving the focal point S in the a3 direction is repeatedly performed while leaving a space in the [1-100] direction. As a result, when the semiconductor substrate 12 is viewed along the c-axis, the modified layer 14 is formed over substantially the entire region of the semiconductor substrate 12.

Figures 6, 7:
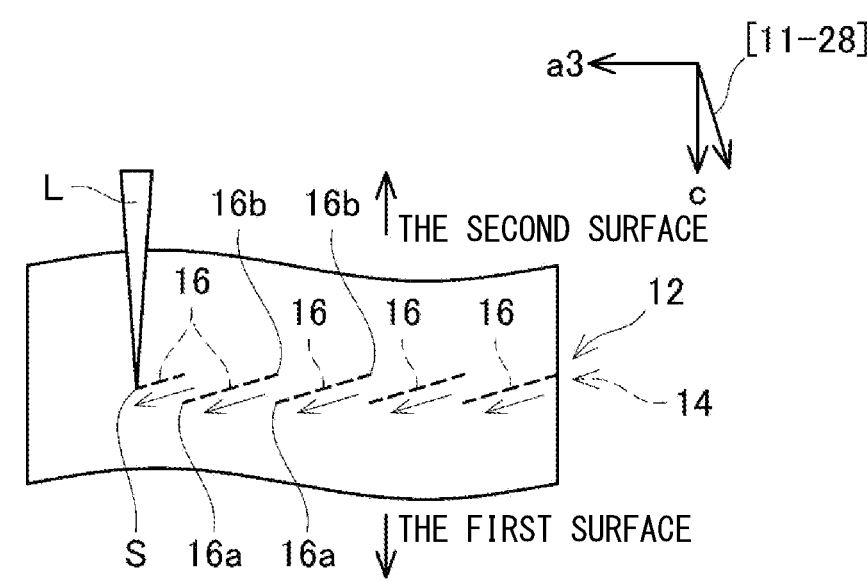
FIG. 6 is a cross-sectional view that illustrates the laser irradiation process according to the first embodiment.
FIG. 7 is a cross-sectional view that illustrates a substrate cutting process according to the first embodiment.

FIG. 6 is a detailed explanatory drawing of the process of moving the focal point S in the a3 direction, and illustrates an enlarged view of the modified layer 14. As indicated by an arrow in FIG. 6, in the process of moving the focal point S in the a3 direction, the process of moving the focal point S along the (11-28) plane tilted to the a3 direction is repetitively performed instead of the process of moving the focal point S in a direction parallel to the a3 direction. A specific modified layer 16 extending along the (11-28) plane is formed by moving the focal point S along the (11-28) plane. In the following, each process of moving the focal point S along the (11-28) plane is referred to as a specific modified layer formation process. The specific modified layer formation process is repeatedly performed while moving in the a3 direction. In other words, when one specific modified layer formation process is completed, the specific modified layer formation process is again performed at the position shifted in the a3 direction. By repeating the specific modified layer formation process, multiple specific modified layers 16 extending along the (11-28) plane are formed. When multiple specific modified layers 16 are formed, multiple specific modified layers 16 are arranged in the a3 direction. The modified layer 14 is an aggregate of multiple specific modified layers 16.

In each specific modified layer formation process, the focal point S is moved from the second surface 12b side to the first surface 12a side along the (11-28) plane. An end portion 16b of each of the specific modified layers 16 on the second surface 12b side is a start position of the focal point S in the specific modified layer formation process, and an end portion 16a of each of the specific modified layers 16 on the first surface 12a side is an end position of the focal point S. In each specific modified layer formation process, the specific modified layer 16 is formed along the path traced by the focal point S from the start position of the focal point S to the end position of the focal point S. After the focal point S is moved to the end position of the present specific modified layer formation process, the target point of the laser L is moved to the start position of the subsequent specific modified layer formation process while the irradiation of the laser L is stopped, and the subsequent specific modified layer formation process is started. Therefore, the modified layer is not formed between two specific modified layers 16. In other words, the modified layer is not formed between the end portion 16a of one specific modified layer 16 and the end portion 16b of the adjacent specific modified layer 16. The energy of the laser L is maintained substantially constant in each specific modified layer formation process. The present specific modified layer formation process corresponds to present execution of the specific modified layer formation process. The subsequent specific modified layer formation process corresponds to subsequent execution of the specific modified layer formation process.

Figure 8:
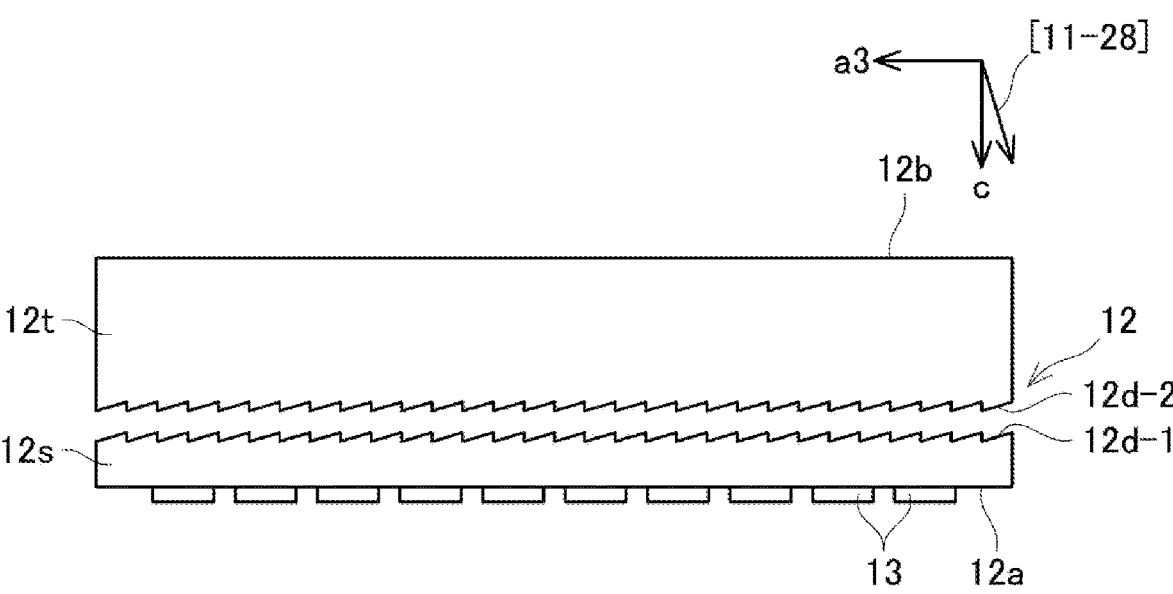
FIG. 8 is a cross-sectional view that illustrates the substrate cutting process according to the first embodiment.

(Substrate Cutting Process) Subsequently, the substrate cutting process is performed. In the substrate cutting process, as illustrated in FIGS. 7, 8, the semiconductor substrate 12 is cut along the modified layer 14, in other words, multiple specific modified layers 16. An element structural portion 12s is peeled off from a base portion 12t. The element structural portion 12s is a portion of the semiconductor substrate 12 at the first surface 12a side. In other words, the element structural portion 12s is a portion where a semiconductor element structure is formed. The base portion 12t is a portion of the semiconductor substrate 12 at the second surface 12b side. For example, it is possible to peel off the element structural portion 12s from the base portion 12t by: fixing the first surface 12a to a first support plate; fixing the second surface 12b a second support plate; and separating the first support plate from the second support plate. In the following, a cutting plane at the element structural portion 12s side is referred to as a cutting plane 12d-1; and a cutting plane at the base portion 12t side is referred to as a cutting plane 12d-2.

Subsequently, the element structural portion 12s is cut into several chips to manufacture a semiconductor device. The base portion 12t is used for manufacturing other semiconductor devices after the cutting plane 12d-2 is polished.

According to the manufacturing method according to the first embodiment, it is possible to generate unintended roughness with protrusions and recessions at the cutting planes 12d-1, 12d-2 of the semiconductor substrate 12. The following describes the manufacturing method according to the first embodiment in comparison to the manufacturing method according to a comparative example.

Figure 9:
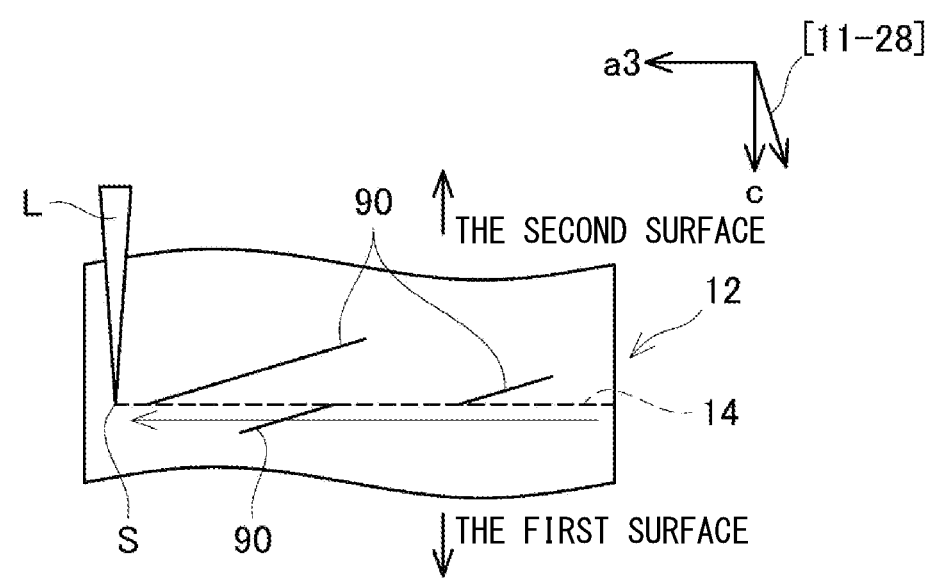
FIG. 9 is a cross-sectional view that illustrates a laser irradiation process according to a comparative example.
Figure 10:
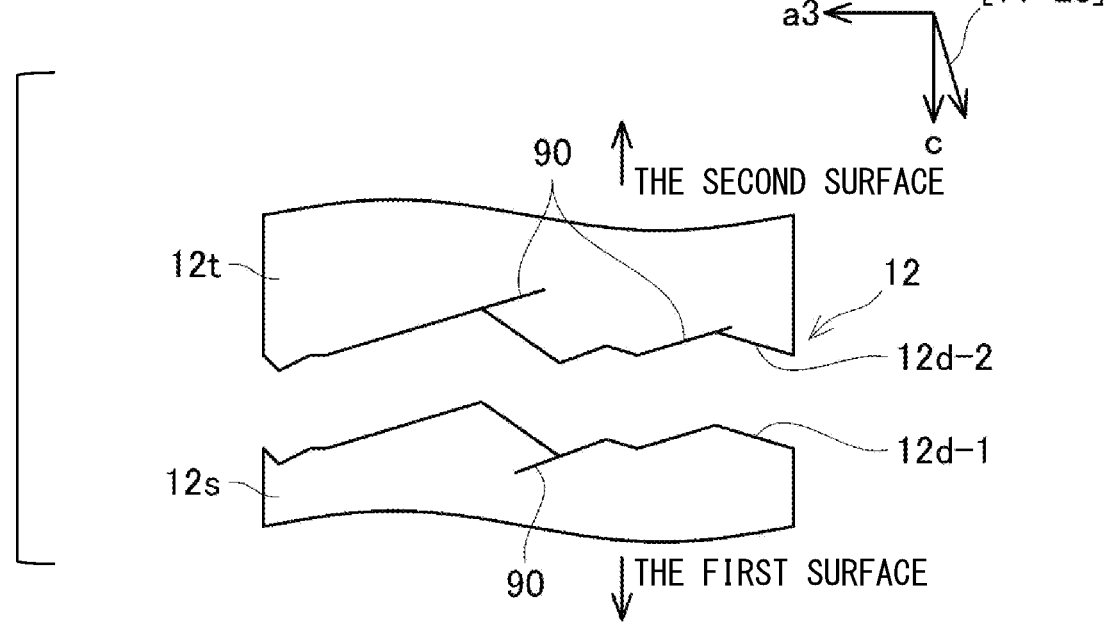
FIG. 10 is a cross-sectional view that illustrates a substrate cutting process according to the comparative example.

FIG. 9 illustrates a laser irradiation process in the manufacturing method according to the comparative example. In the laser irradiation process according to the comparative example, the focal point S is moved in a direction parallel to the crystal plane, in other words, the c-plane parallel to the first surface 12a of the semiconductor substrate 12. Accordingly, the modified layer 14 is formed parallel to the c-plane. In the first embodiment, when a micro area is in an enlarged view as illustrated in FIG. 6, the modified layer 14, in other words, each of the specific modified layers 16 is formed to be parallel to the (11-28) plane. In the comparative example, when a micro area is in an enlarged view as illustrated in FIG. 9, the modified layer 14 is formed to be parallel to the c-plane. When the micro area is in the enlarged view, the extending direction of the modified layer 14 in the first embodiment is different from the extending direction of the modified layer 14 in the comparative example. In the laser irradiation process, since the semiconductor substrate 12 is heated to a high temperature at the focal point S, high stress is generated around the focal point S. As described above, the semiconductor substrate 12 is easily cleaved along the (11-28) plane. As illustrated in FIG. 9, in the laser irradiation process according to the comparative example, a deep crack 90 is easily generated along the (11-28) plane from the modified layer 14 due to the generation of high stress at the focal point S. The deep crack 90 may also be simply referred to as a crack 90 in the following. In the comparative example, the deep crack 90 is easily generated from the modified layer 14 to the periphery of the modified layer 14. As illustrated in FIG. 10, in the substrate cutting process according to the comparative example, when the semiconductor substrate 12 is cut along the modified layer 14, the semiconductor substrate 12 is likely to crack along the crack 90. As a result, large surface roughness is easily generated at the cutting planes 12*d*-1, 12*d*-2. Since the crack 90 is unintentionally generated, it is difficult to control the surface roughness of the cutting planes 12*d*-1, 12*d*-2. The deep crack 90 remains at the cutting planes 12*d*-1, 12*d*-2. After the cutting process, it is necessary to remove the crack 90 by extensively polishing the cutting planes 12*d*-1, 12*d*-2.

In contrast, in the laser irradiation process according to the first embodiment, each of the specific modified layers 16 is formed to extend along the (11-28) plane as illustrated in FIG. 6. When each of the specific modified layers 16 is formed along the (11-28) plane where cleavage is likely to occur, the crack 90 is less likely to occur. In the substrate cutting process, the semiconductor substrate 12 is easily cut accurately along the modified layer 14. As illustrated in FIG. 7, large surface roughness is less likely to occur at the cutting planes 12*d*-1, 12*d*-2. As illustrated in FIG. 7, in the manufacturing method according to the first embodiment, although the surface roughness is formed along the modified layer 14 at the cutting planes 12*d*-1, 12*d*-2, this surface roughness is smaller than the surface roughness generated by the crack. According to the manufacturing method in the first embodiment, it is possible to inhibit large surface roughness at the cutting planes 12*d*-1, 12*d*-2. In the manufacturing method according to the first embodiment, since the semiconductor substrate 12 is easily cut along the modified layer 14, the surface roughness of each of the cutting planes 12*d*-1, 12*d*-2 is easily controlled. In the manufacturing method according to the first embodiment, the crack 90 is unlikely to exist at the cutting planes 12*d*-1, 12*d*-2. Therefore, the amount of polishing at the time of polishing the cutting planes 12*d*-1, 12*d*-2 may be smaller for removing the crack 90. If the crack 90 has almost no influence, it may not be necessary to polish the cutting plane 12*d*-1 or the cutting plane 12*d*-2.

In a case where the cutting plane 12*d*-1 is not polished, the cutting plane 12*d*-1 with surface roughness becomes the rear surface of the semiconductor device. In other words, the semiconductor device has multiple protrusions at the rear surface, and each of the protrusions has a tilted surface along the (11-28) plane. In this case, it is possible to enhance the adhesion between the electrode and the cutting plane 12*d*-1, when the electrode is formed at the cutting plane 12*d*-1 having roughness.

Figure 11:
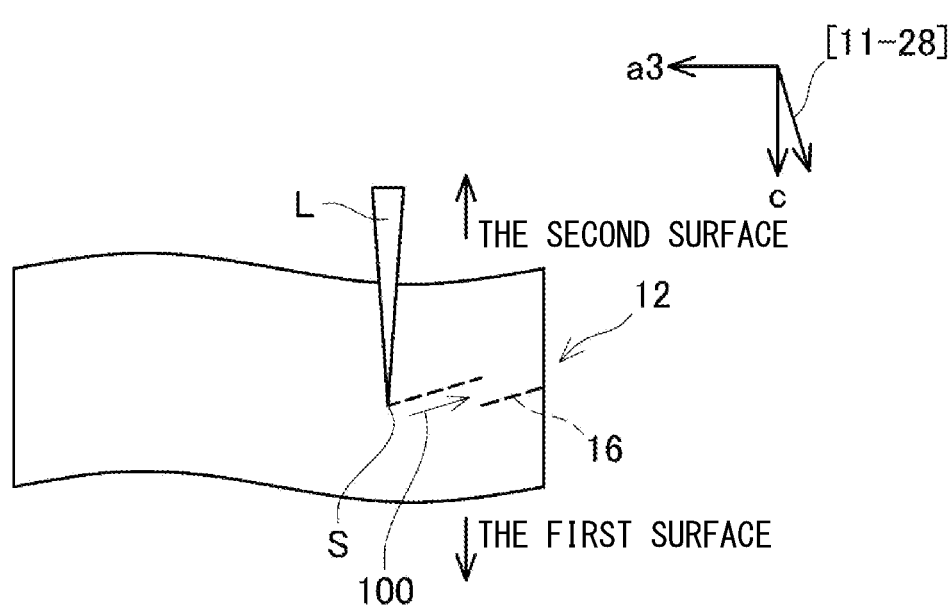
FIG. 11 is a cross-sectional view that illustrates the laser irradiation process according to the first embodiment.

In a case where the laser L is irradiated from the second surface 12*b* side, a semiconductor region, in other words, the base portion 12*t*, closer to the second surface 12*b* with respect to the modified layer 14 tends to have a higher temperature than another semiconductor region, in other words, the element structural portion 12*s*, closer to the first surface 12*a* with respect to the modified layer 14. For example, as illustrated in FIG. 9, the deep crack 90 is easily generated closer to the second surface 12*b* with respect to the modified layer 14. As in the first embodiment with reference to FIG. 6, in each specific modified layer formation process, it is possible to effectively inhibit the generation of the crack 90 when the focal point S is moved from the second surface 12*b* side to the first surface 12*a* side along the (11-20) plane. For example, FIG. 11 illustrates a state in the halfway of the specific modified layer formation process in the first embodiment. In the state in the halfway of the specific modified layer formation process, the specific modified layer 16 is present in a direction from the focal point S toward the second surface 12*b* along the (11-28) plane. Since the specific modified layer 16 is a region with reduced crystallinity, the crack is less likely to occur in the specific modified layer 16. Therefore, it is possible to inhibit the generation of the crack from the position of the focal point S toward the second surface 12*b* along the (11-28) plane.

Figure 12:
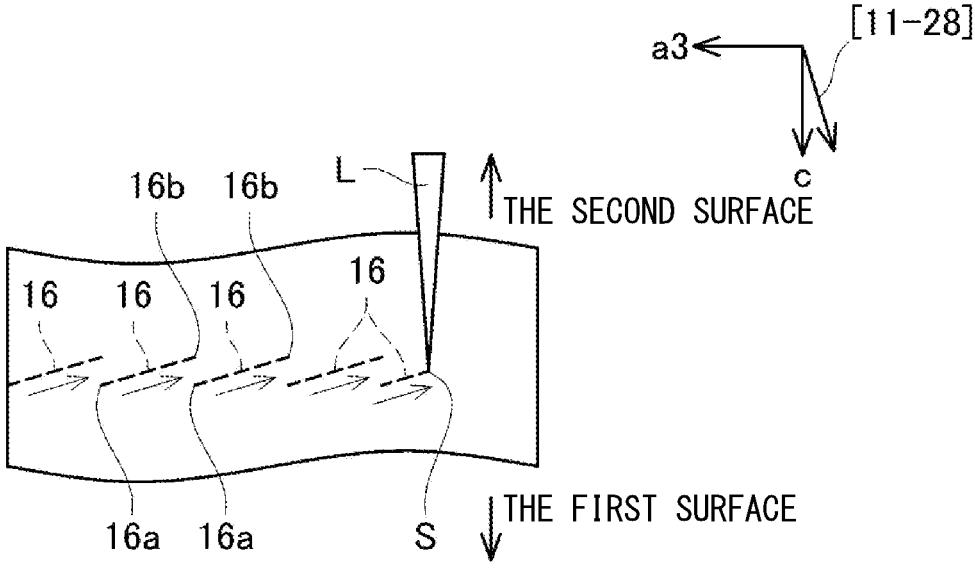
FIG. 12 is a cross-sectional view that illustrates a laser irradiation process according to a modified example of the first embodiment.
Figure 13:
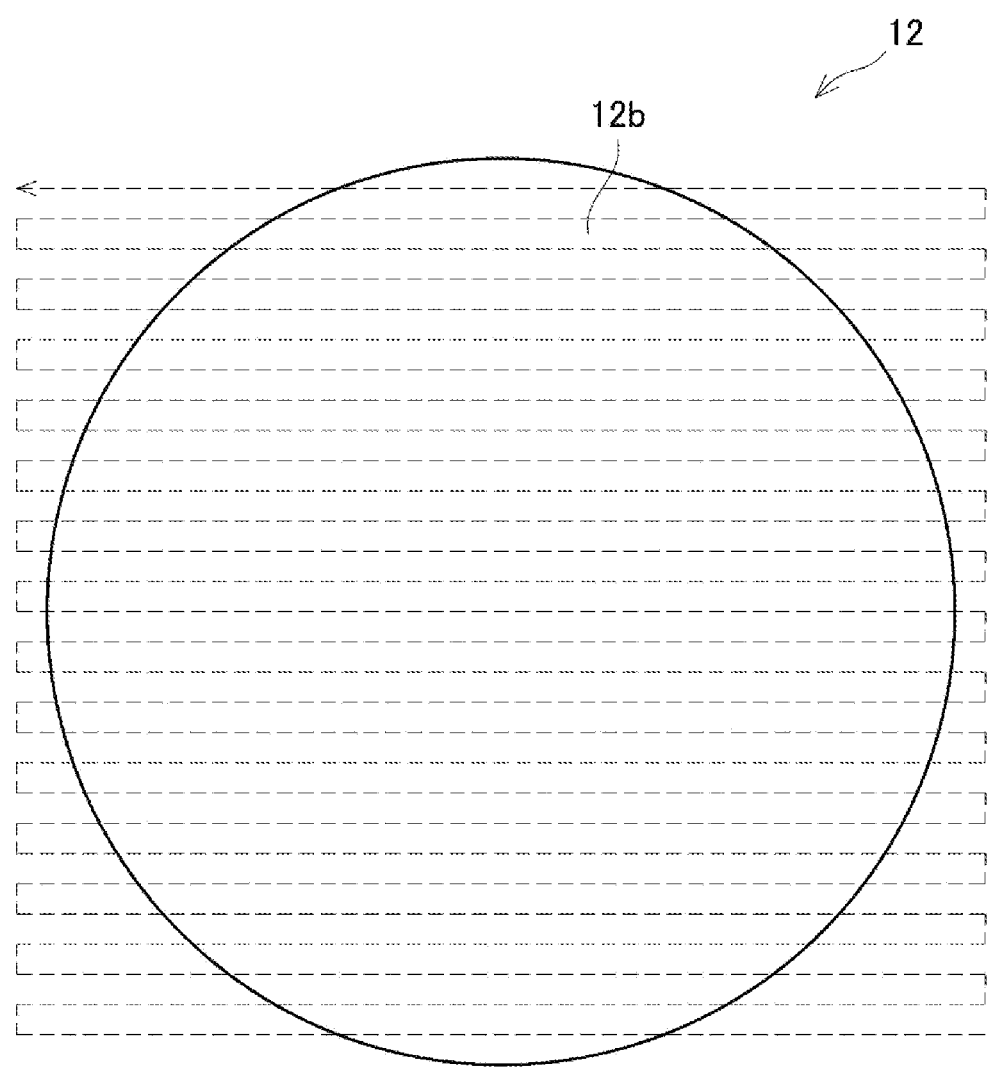
FIG. 13 is a plan view showing a reciprocating path traced by the laser's focal point.
Figure 13:
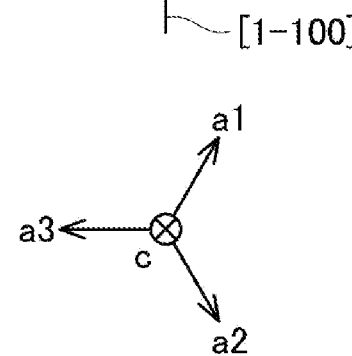

The orientation of the movement of the focal point S may be reversed with respect to FIG. 6, in a case where the generation of the crack 90 toward the second surface 12*b* has less influence. As illustrated in an arrow in FIG. 12, the focal point S may be moved from the end portion 16*a* toward the end portion 16*b*. By the combination of the movement directions respectively in FIGS. 6, 12, the focal point S may be moved in a reciprocating manner as illustrated in FIG. 13.

(Second Embodiment) A manufacturing method described in a second embodiment is different from the manufacturing method described in the first embodiment in the laser irradiation process. Other parts of the manufacturing method of the second embodiment are the same as those of the first embodiment.

Figure 14:
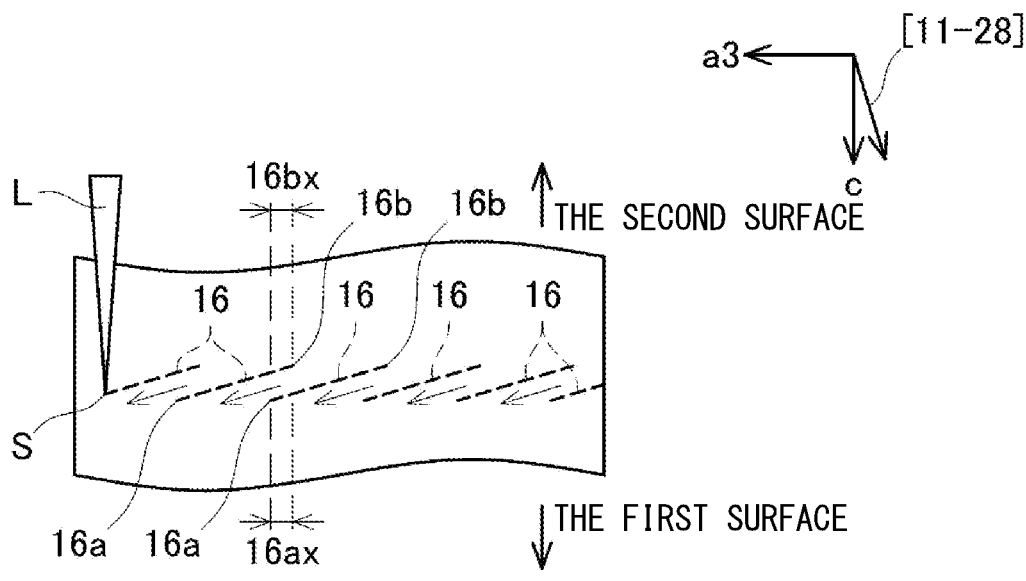
FIG. 14 is a cross-sectional view of a laser irradiation process according to a second embodiment.

In the second embodiment, as illustrated in FIG. 14, in a view of the thickness direction, in other words, the c-direction of the semiconductor substrate 12, multiple specific modified layers 16 are formed such that adjacent specific modified layers 16 partially overlap each other. In FIG. 14, in a view of the thickness direction of the semiconductor substrate 12, a section 16*ax* in the vicinity of the end portion 16*a* of each of the specific modified layer 16 overlaps a section 16*bx* in the vicinity of the end portion 16*b* of the adjacent specific modified layer 16.

Figure 15:
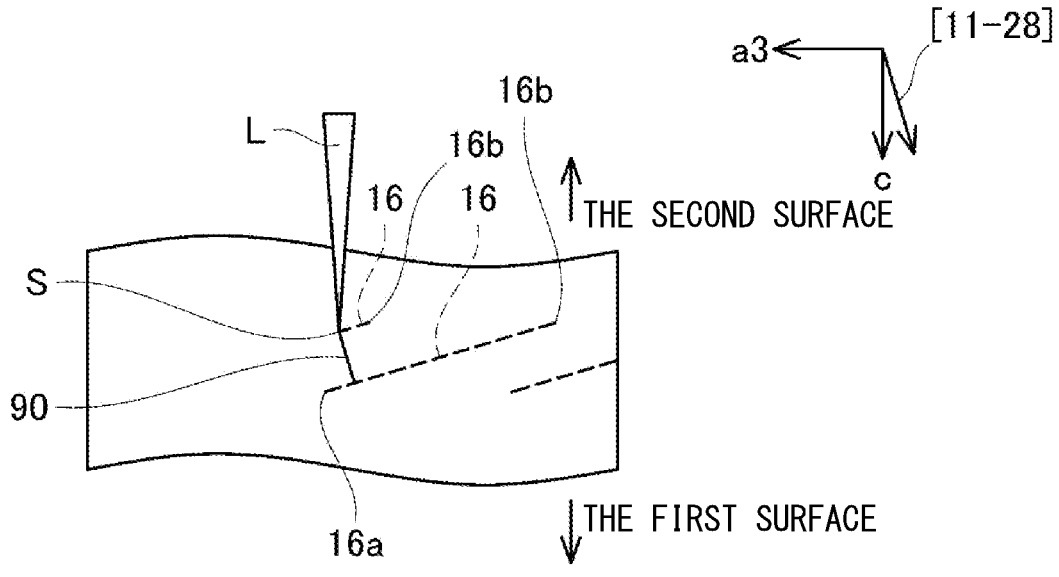
FIG. 15 is a cross-sectional view that illustrates the laser irradiation process according to the second embodiment.

According to the manufacturing method in the second embodiment, it is possible to effectively inhibit the generation of the crack 90 in the vicinity of the end portion 16*b* of each of the specific modified layers 16 as described in the following. As described above, the end portion 16*b* is a start position of the focal point S in each of the specific modified layer formation processes. The start position of the focal point S is a position where a crystal defect in the specific modified layer 16 is initially formed, and the crack 90 is likely to occur. As in the second embodiment, in a case where the section 16*ax* of each of the specific modified layers 16 overlaps the section 16*bx* of the adjacent specific modified layer 16, the crack 90 collides with another specific modified layer 16 when the crack 90 generates in a downward direction from a location in the vicinity of the focal point S, in other words, a location in the vicinity of the end portion 16*b* as shown in FIG. 15. Since the specific modified layer 16 has reduced crystallinity, the progression of the crack 90 stops at the intersecting portion between the specific modified layer 16 and the crack 90. Thus, the generation of the deep crack 90 is inhibited. According to the manufacturing method in the second embodiment, it is possible to effectively inhibit the generation of the crack 90 in the vicinity of the end portion 16*b*.

(Third Embodiment) A manufacturing method described in a third embodiment is different from the manufacturing method described in the first embodiment in the laser irradiation process. Other parts of the manufacturing method of the third embodiment are the same as those of the first embodiment.

Figure 16:
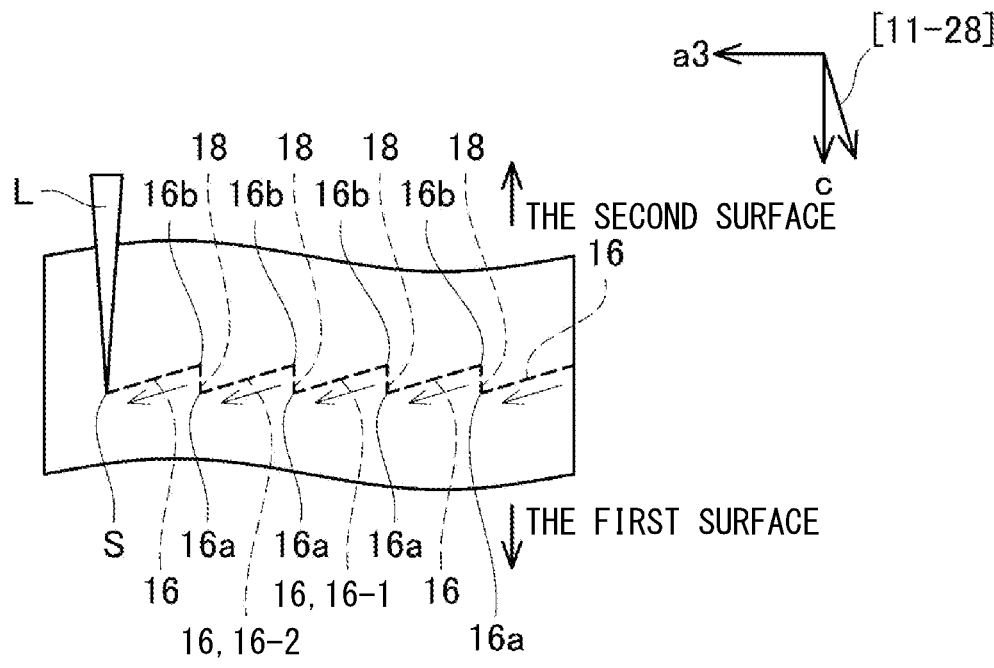
FIG. 16 is a cross-sectional view that illustrates a laser irradiation process according to a third embodiment.

In the laser irradiation process described in the third embodiment, as illustrated in FIG. 16, a connection modified layer 18 is formed to connect the end portion 16*b* of the specific modified layer 16 and the end portion 16*a* of the adjacent specific modified layer 16. When one specific modified layer formation process is completed, the focal point S is shifted from the end position of the previous specific modified layer formation process to the start position of the subsequent specific modified layer formation process. For example, in FIG. 16, when the formation process of the specific modified layer 16-1 is completed, the focal point S is moved from the end position, in other words, the end portion 16*a* of the specific modified layer 16-1 to the start position, in other words, the end portion 16*b*, of the specific modified layer 16-2 in a state in which the irradiation of the laser Lis continued. In other words, the focal point S is moved in a zigzag manner. By moving the focal point S, the connection modified layer 18 is formed. The connection modified layer 18 connects the specific modified layers 16.

In the substrate cutting process described in the third embodiment, the substrate is cut along the specific modified layer 16 and the connection modified layer 18. The semiconductor substrate 12 is cut while being guided by the connection modified layer 18 in a region between the adjacent specific modified layers 16. Therefore, it is possible to accurately control the shape of the cutting planes 12*d*-1, 12*d*-2.

(Fourth Embodiment) A manufacturing method described in a fourth embodiment is different from the manufacturing method described in the first embodiment in the laser irradiation process. Other parts of the manufacturing method of the fourth embodiment are the same as those of the first embodiment.

Figure 17:
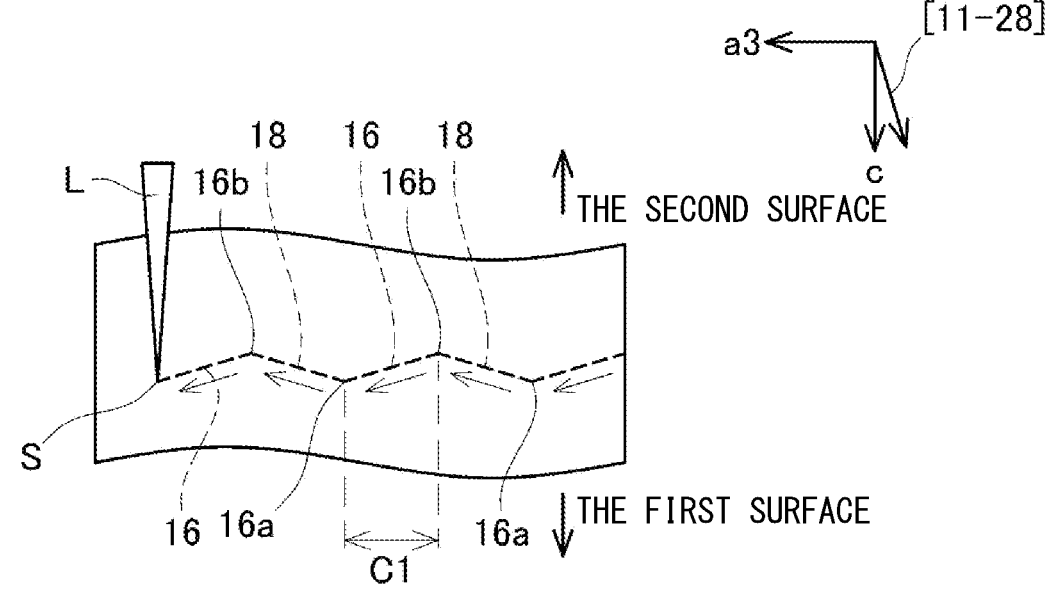
FIG. 17 is a cross-sectional view that illustrates a laser irradiation process according to a fourth embodiment.
Figure 18:
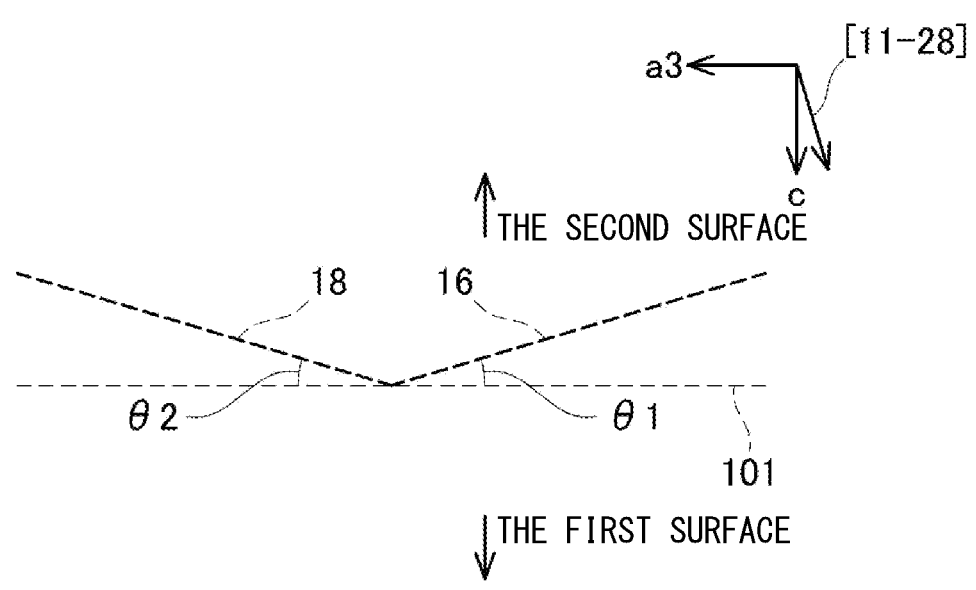
FIG. 18 is a cross-sectional view that illustrates a tilted angle between a specific modified layer and a connection modified layer at an m-plane in the fourth embodiment.

As illustrated in FIG. 17, in the laser irradiation process described in the fourth embodiment, the spacing between the specific modified layers 16 in the a3 direction is relatively wide as compared with the first embodiment. In the fourth embodiment, a relatively wide spacing C1 is provided between the end portion 16*b* of the specific modified layer 16 and the end portion 16*a* of the adjacent specific modified layer 16. As similar to the third embodiment, in the laser irradiation process described in the fourth embodiment, the connection modified layer 18 is formed to connect the end portion 16*b* of the specific modified layer 16 and the end portion 16*a* of the adjacent specific modified layer 16. In the fourth embodiment, the connection modified layer 18 is formed to be tilted to the first surface 12*a* on a side opposite from the specific modified layer 16. FIG. 18 indicates a tilted angle between the specific modified layer 16 and the connection modified layer 18. A broken line 101 in FIG. 18 indicates a plane parallel to the first surface 12*a*. As illustrated in FIG. 18, the specific modified layer 16 is tilted at an angle θ1 with respect to the first surface 12*a*, and the connection modified layer 18 is tilted at an angle θ2 with respect to the first surface 12*a* on a side opposite from the specific modified layer 16. As described above, the angle θ1 is 21.8 degrees. The angle θ2 is the same angle as the angle θ1. In other words, the angle θ2 is 21.8 degrees. That is, the connection modified layer 18 extends along a (−1-128) plane.

The (−1-128) plane is a crystal plane having symmetry with respect to the (11-28) plane, and is a crystal plane at which cleavage easily occurs. Therefore, the (−1-128) plane is more likely to be cleaved than the c-plane. When the connection modified layer 18 is formed along the (−1-128) plane, the crack is hardly generated at the formation of the connection modified layer 18.

Figure 19:
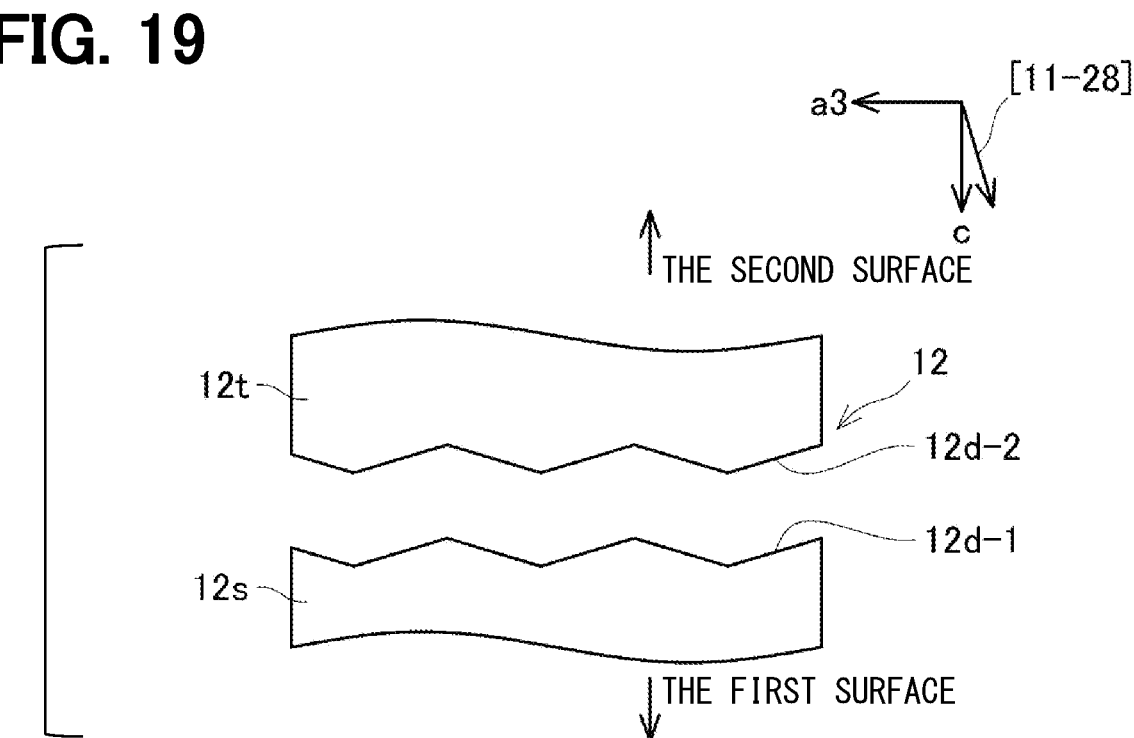
FIG. 19 is a cross-sectional view that illustrates a substrate cutting process according to the fourth embodiment.

In the substrate cutting process described in the fourth embodiment, the substrate is cut along the specific modified layer 16 and the connection modified layer 18 as illustrated in FIG. 19. The semiconductor substrate 12 is cut while being guided by the connection modified layer 18 in a region between the adjacent specific modified layers 16. Therefore, it is possible to accurately control the shape of the cutting planes 12*d*-1, 12*d*-2. In the fourth embodiment, since a corner portion of roughness formed at the cutting planes 12*d*-1, 12*d*-2 becomes an obtuse angle, chipping is less likely to occur in the substrate cutting process.

In the fourth embodiment, the connection modified layer 18 is formed along the (−1-128) plane, the connection modified layer 18 may be formed along another crystal plane that is easily to be cleaved as compared with the c-plane.

(Fifth Embodiment) A manufacturing method described in a fifth embodiment is different from the manufacturing method described in the first embodiment in the laser irradiation process. Other parts of the manufacturing method of the fifth embodiment are the same as those of the first embodiment.

Figure 20:
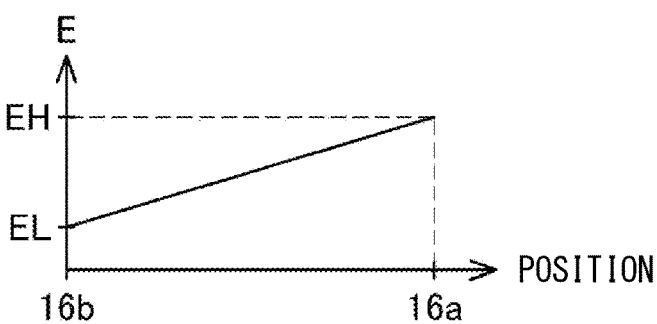
FIG. 20 is a graph that illustrates a change in an energy of a laser in a laser irradiation process according to a fifth embodiment.

As described above, the energy of the laser L is maintained substantially constant during each specific modified layer formation process in the first embodiment. In contrast, in the fifth embodiment, the energy of the laser L is increased in each specific modified layer formation process in the fifth embodiment. FIG. 20 illustrates a change in the energy E of the laser L in the specific modified layer formation process in the fifth embodiment. The horizontal axis of FIG. 20 indicates the position of the focal point S.

As described above, the crack 90 is likely to occur at the start position of the focal point S. In the specific modified layer formation process in the fifth embodiment, as illustrated in FIG. 20, the laser L with a low energy EL is irradiated at the start point of the focal point S. Therefore, the generation of the crack at the start position of the focal point S is inhibited. As illustrated in FIG. 20, in the specific modified layer formation process, the energy E of the laser L is increased along with the movement of the focal point S. At the irradiation end position of the laser L, in other words, the end portion 16*a*, the energy E of the laser L is increased to the energy EH. By increasing the energy E of the laser L in the specific modified layer formation process, the generation of the crack at the start position of the focal point S is inhibited while the specific modified layer 16 is appropriately formed.

Figure 21:
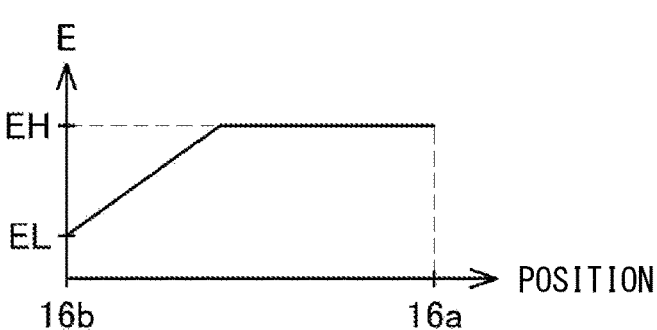
FIG. 21 is a graph that illustrates a change in an energy of a laser in a laser irradiation process according to a modified example of the fifth embodiment.
Figure 22:
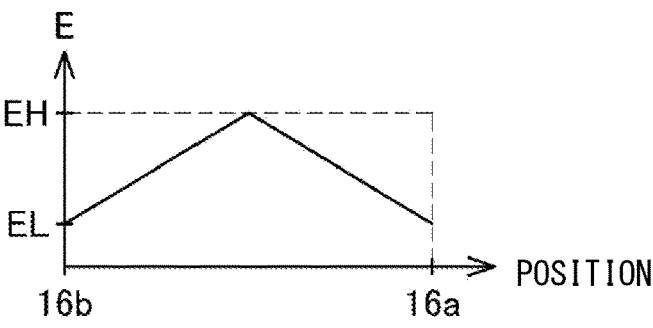
FIG. 22 is a graph that illustrates a change in the energy of the laser in the laser irradiation process according to the modified example of the fifth embodiment.
Figure 23:
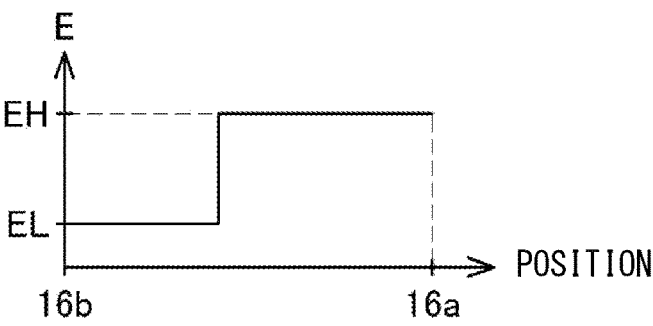
FIG. 23 is a graph that illustrates a change in the energy of the laser in the laser irradiation process according to the modified example of the fifth embodiment.

Since the crack is easily generated at the start position of the focal point S, as illustrated in FIG. 21, the energy E may be increased in the vicinity of the start point of the focal point S, and the energy E may be kept constant at the latter stage of the specific modified layer formation process. As illustrated in FIG. 22, the energy E may be increased in the vicinity of the start position of the focal point S, and the energy E may be decreased at the latter stage of the specific modified layer formation process. Additionally, as illustrated in FIG. 23, the energy E of the laser L may be changed in a stepwise manner.

Although the first to fifth embodiments are separately described, the first to fifth embodiments may also be combined.

The (11-28) plane described above corresponds to a specific crystal plane and a first specific crystal plane. The a3 direction corresponds to a direction parallel to the surface of the semiconductor substrate. The end portion 16*b* described above corresponds to a start position of the focal point in the specific modified layer formation process. The end portion 16*a* described above corresponds to an end position of the focal point in the specific modified layer formation process. The (−1-128) plane described above corresponds to a second specific crystal plane. The first surface 12*a* described above corresponds to a front surface of the semiconductor substrate of the semiconductor device. The cutting plane 12*d*-1 described above corresponds to a rear surface of the semiconductor substrate of the semiconductor device.

Although the embodiments have been described in detail above, these are merely examples and do not limit the scope of present disclosure. The techniques described in the present disclosure include various modifications and modifications of the specific examples illustrated above. The technical elements described in the present disclosure or the drawings exhibit technical usefulness alone or in various combinations, and are not limited to the combinations described in the present disclosure at the time of filing. In addition, the techniques illustrated in the present specification or drawings achieve multiple objectives at the same time, and achieving one of the objectives itself has technical usefulness.

What is claimed is:

1. A semiconductor substrate for a semiconductor device, the semiconductor substrate comprising:

a front surface and a rear surface located on a side opposite from the front surface, wherein the semiconductor substrate includes a specific crystal plane forming an acute angle with respect to the front surface and defining a direction along which the semiconductor substrate is more easily cleaved than along a direction parallel to the front surface under a constant energy of a cleaving tool, wherein the rear surface has surface roughness with a plurality of protrusions, wherein each of the plurality of protrusions has a tilted surface extending along the specific crystal plane, and wherein the front surface of the semiconductor substrate is a c-plane.

2. The semiconductor substrate according to claim 1, wherein the semiconductor substrate is made of gallium nitride, wherein the front surface of the semiconductor substrate is the c-plane of the gallium nitride, and wherein the specific crystal plane is a (11-28) plane of the gallium nitride.

3. The semiconductor substrate according to claim 1, wherein the semiconductor substrate is made of gallium nitride, wherein the front surface of the semiconductor substrate is the c-plane of the gallium nitride, and wherein the specific crystal plane is tilted to the c-plane at an angle of 21.8 degrees in a cross section along an m-plane of the gallium nitride.

4. The semiconductor substrate according to claim 1, wherein a tip of each of the plurality of protrusions points away from the rear surface of the semiconductor substrate.

5. The semiconductor substrate according to claim 1, wherein the semiconductor substrate is made of a material having a hexagonal crystal structure.

6. The semiconductor substrate according to claim 1, wherein the semiconductor substrate is made of a single crystal material having a hexagonal crystal structure.

7. The semiconductor substrate according to claim 1, wherein the semiconductor substrate is made of gallium nitride.

8. The semiconductor substrate according to claim 1, wherein the semiconductor substrate has optical transparency.

9. The semiconductor substrate according to claim 5, wherein the semiconductor substrate has optical transparency.

10. A semiconductor substrate for a semiconductor device, the semiconductor substrate comprising:

a front surface; and a rear surface located on a side opposite from the front surface, wherein the semiconductor substrate is made of single-crystal gallium nitride, the front surface is a c-plane of the single-crystal gallium nitride, the rear surface has surface roughness with a plurality of protrusions, and each of the plurality of protrusions has a tilted surface being a (11-28) plane of the single-crystal gallium nitride.

* * * * *